US010896720B2

(12) United States Patent
Morishige

(10) Patent No.: US 10,896,720 B2
(45) Date of Patent: Jan. 19, 2021

(54) APPARATUSES AND METHODS FOR DRIVERS WITH REDUCED NOISE

(71) Applicant: MICRON TECHNOLOGY, INC., Boise, ID (US)

(72) Inventor: Kazuyuki Morishige, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/692,204

(22) Filed: Nov. 22, 2019

(65) Prior Publication Data

US 2020/0105333 A1   Apr. 2, 2020

Related U.S. Application Data

(63) Continuation of application No. 16/144,693, filed on Sep. 27, 2018, now Pat. No. 10,522,208.

(51) Int. Cl.
*G11C 11/40* (2006.01)
*G11C 11/4076* (2006.01)
*H01L 23/00* (2006.01)
*G06F 1/10* (2006.01)
*G11C 7/22* (2006.01)

(52) U.S. Cl.
CPC ............ *G11C 11/4076* (2013.01); *G06F 1/10* (2013.01); *G11C 7/222* (2013.01); *H01L 24/42* (2013.01)

(58) Field of Classification Search
CPC ...... G11C 29/842; G11C 21/005; G11C 21/02
See application file for complete search history.

(56) References Cited

U.S. PATENT DOCUMENTS

| 6,104,253 A | 8/2000 | Hall et al. | |
|---|---|---|---|
| 2005/0057288 A1* | 3/2005 | Senda | G11C 16/30 327/148 |
| 2006/0255836 A1* | 11/2006 | Ikeda | H03K 19/01721 326/83 |
| 2014/0176197 A1* | 6/2014 | Shon | H03K 3/01 327/108 |
| 2018/0351770 A1 | 12/2018 | Chiu et al. | |

OTHER PUBLICATIONS

U.S. Appl. No. 16/144,693, titled "Apparatuses and Methods for Drivers With Reduced Noise", filed Sep. 27, 2018.

* cited by examiner

*Primary Examiner* — Han Yang
(74) *Attorney, Agent, or Firm* — Dorsey & Whitney LLP

(57) ABSTRACT

Embodiments of the disclosure are drawn to apparatuses and methods for drivers with reduced voltage noise. Clock signals may be provided to semiconductor devices, and may be distributed throughout the device. Driven are provided along signal paths within the device which may act as buffers for the clock signals. Each clock signal may be coupled to multiple driver circuits within the driver. Each of the multiple driver circuits may be coupled to a different pair of power supply voltage lines. The driver circuits may all have a similar delay to each other.

20 Claims, 12 Drawing Sheets

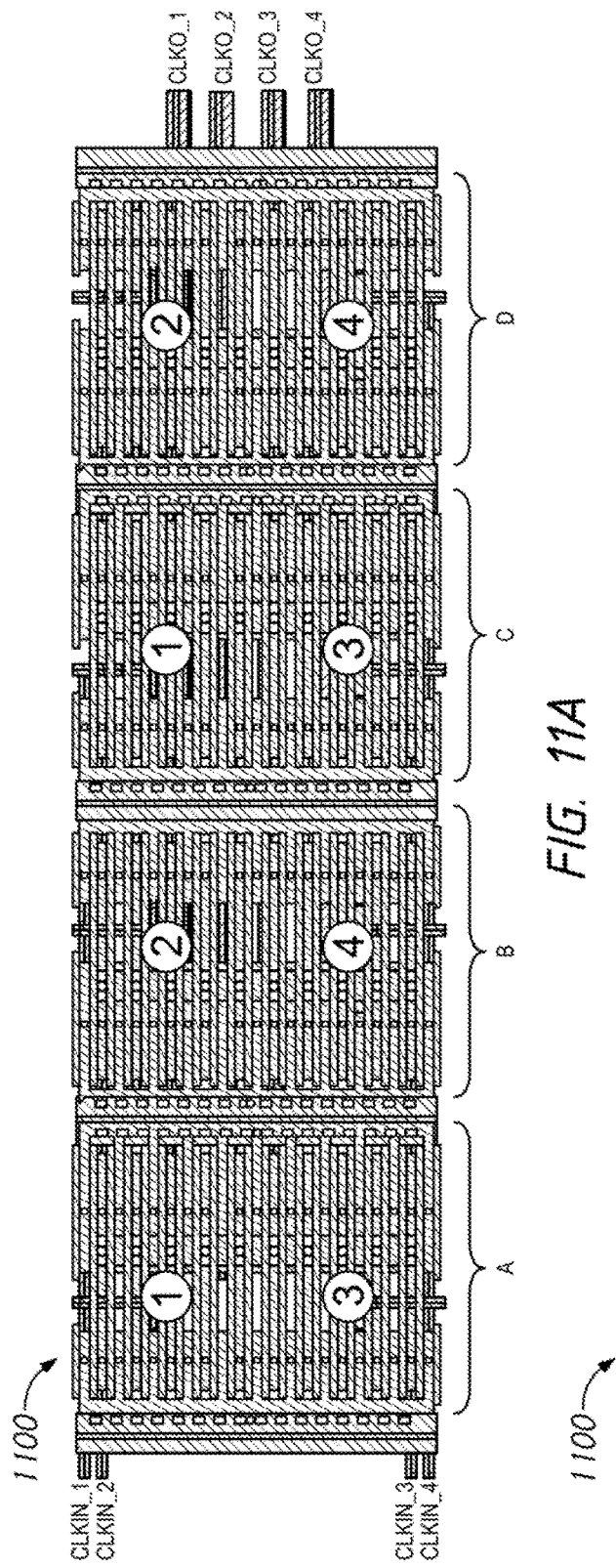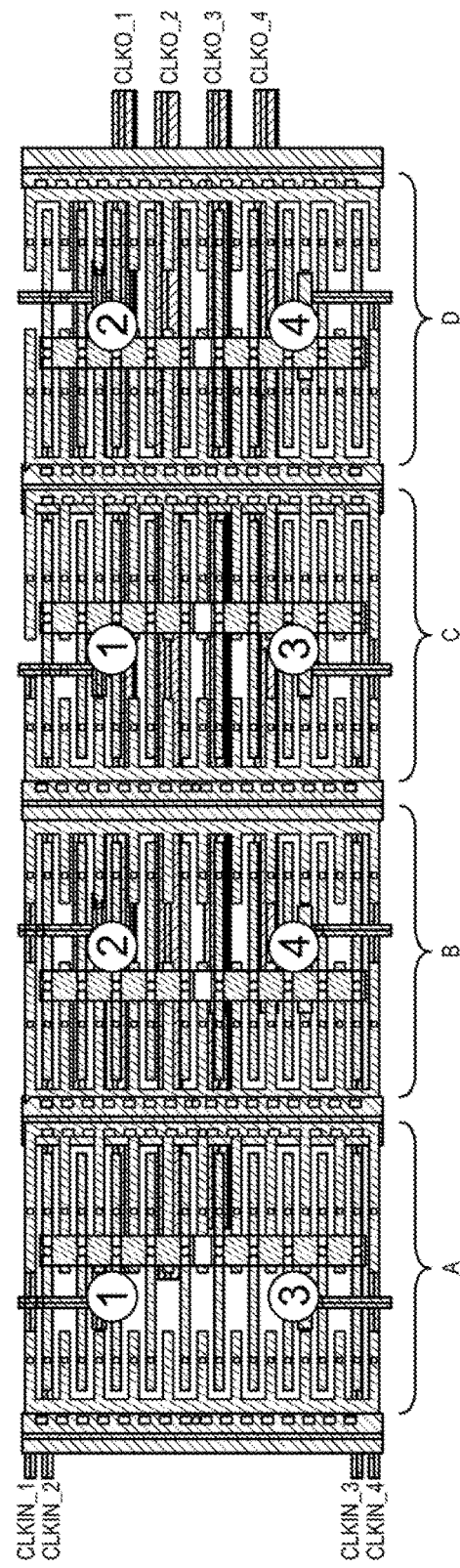
FIG. 11A
FIG. 11B

APPARATUSES AND METHODS FOR DRIVERS WITH REDUCED NOISE

CROSS-REFERENCE TO RELATED APPLICATION(S)

This application is a continuation of U.S. patent application Ser. No. 16/144,693, filed on Sep. 27, 2018. The aforementioned application is incorporated herein by reference, in its entirety, for any purpose.

BACKGROUND

Semiconductor devices may be used for a variety of applications. For example, semiconductor devices such as semiconductor memory devices may be used to store and retrieve information in computer systems. External clock signals may be provided to the semiconductor device (and/or generated by the semiconductor device) to synchronize the operation of various components to a common timing signal. The external clock signal may be used by the semiconductor device to generate internal clock signals. The internal clock signals may be used to control the timing of operation of various circuits of the semiconductor device. The circuits may be in various locations of the semiconductor device. As a result, the internal clock signals may need to be distributed to various points around the semiconductor device in order to control the timing of the various circuits.

The internal dock signals may decay as they travel around the semiconductor device. Driver circuits may be used to boost the clock signal by, for example, amplifying the clock signals amplitude and/or current. Because the driver circuits may draw power from power supply voltages of the semiconductor device, they may introduce voltage noise to the clock signals. The voltage noise may distort the waveform of the clock signals, and may reduce performance characteristics of the semiconductor device. It may be desirable to reduce the voltage noise added by the driver circuits.

BRIEF DESCRIPTION OF THE DRAWINGS

FIGS. 11A and 11B are diagrams of layout data for a driver according to an embodiment of the present disclosure.

DETAILED DESCRIPTION

Figure 1:
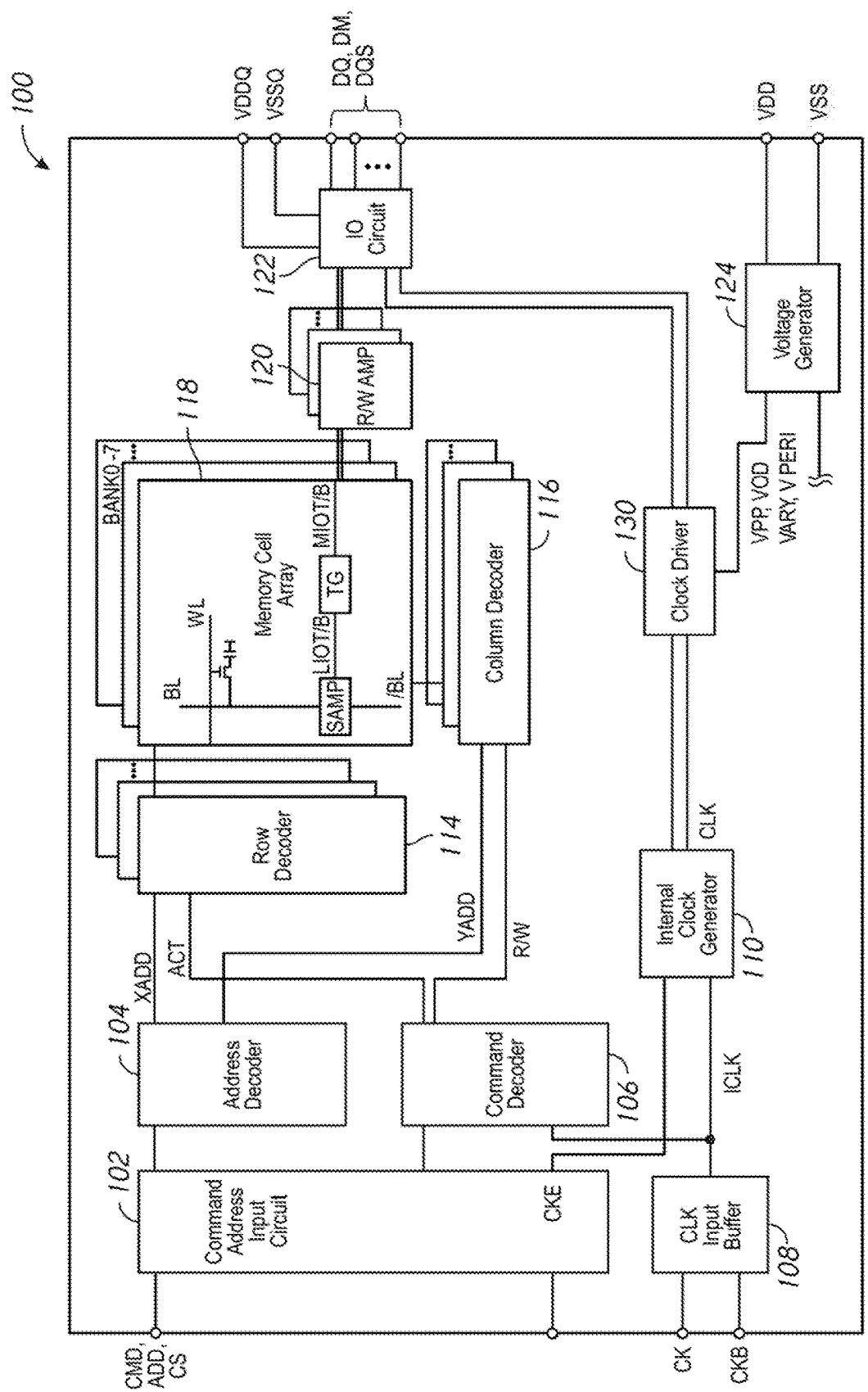
FIG. 1 is a block diagram of an apparatus according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Embodiments of the present disclosure may be referenced with respect to certain descriptions of orientation (e.g., an upper surface, a lower portion, vertical alignment, etc.). It should be understood that these are used for descriptive purposes only to describe the relative positioning of certain components to each other, and that embodiments of the present disclosure may have any orientation in space.

A semiconductor device may conduct one or more operations which need to have controlled timing. The semiconductor device may receive (and/or generate) one or more clock signals, which may be used to control the timing of operations of the device. The clock signals may generally be electrical signals which alternate between a high clock level (e.g., a high voltage level) and a low clock level (e.g., a low voltage level, such as ground) at some frequency. The clock signals may be used to generate internal clock signals. The device may generate multiple clock signals with the same frequency, which may be distinguished by a change in phase between the different signals. The device may need to distribute the clock signals to different components of the device.

As the clock signals are distributed, they, may undergo signal degradation, for example, due to resistances along conductive path they travel along. The device may, use, one or more driver circuits, which may reduce and/or eliminate the effects of degradation by, for example, boosting the current of the clock signals. The driver circuits may be coupled to power supply voltages (e.g., Vdd and Vss) to provide power for boosting the clock circuits. The power supply voltages may introduce voltage noise into the clock signals at the driver circuits, which may degrade the waveform.

The present disclosure is directed to drivers with reduced voltage noise. The clock signal may be split to two (or more) driver circuits. Each of the driver circuits may be coupled to a different pair of lines providing the power supply voltages. The clock signal may be recombined at a node after the driver circuits. Since the current of the clock signal is lowered when the clock signals are split, the driver circuits may draw less power, and thus run a lower risk of voltage noise.

Although the present disclosure described with respect to a semiconductor memory device as a specific example, it is to be understood by one of skill in the art that the present disclosure may be used with the clock signals of any semiconductor device.

FIG. 1 is a block diagram of an apparatus according to an embodiment of the disclosure. The apparatus may be a semiconductor device 100, and will be referred to as such. In some embodiments, the semiconductor device 100 may include, without limitation, a DRAM device, such as a memory integrated into a single semiconductor chip, for example.

Figure 2:
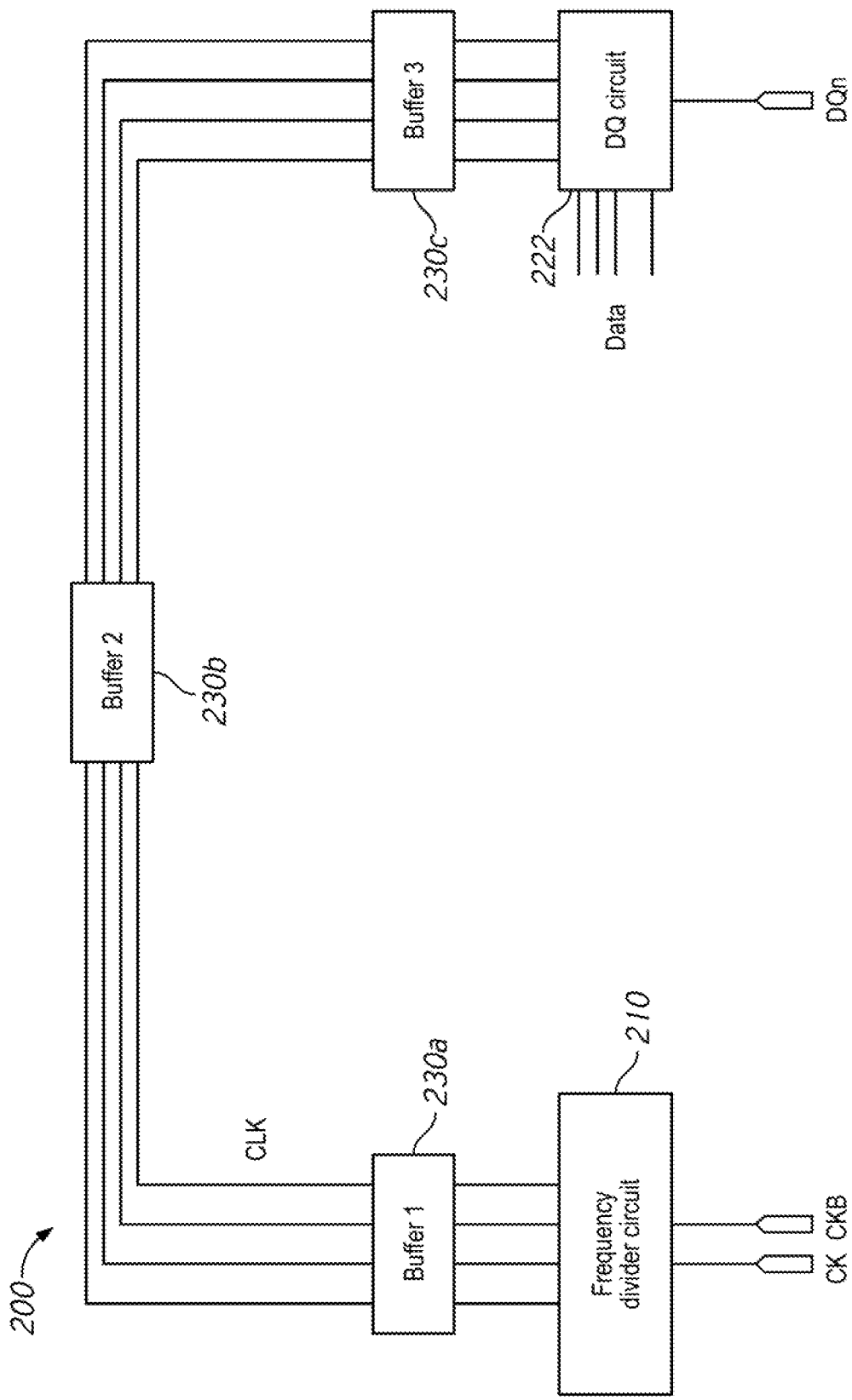
FIG. 2 is a schematic diagram of a clock path in a semiconductor memory device according to an embodiment of the present disclosure.

The semiconductor device 100 includes a memory array 118. The memory array 118 is shown as including a plurality of memory banks. In the embodiment of FIG. 1, the memory array 118 is shown as including eight memory banks BANK0-BANK7. Each memory bank includes a plurality of word lines WL, a plurality of bit lines BL and /BL, and a plurality of memory cells MC arranged at intersections of the plurality of word lines WE and the plurality of bit lines BL and /BL. The selection of the word line WL is performed by a row decoder 114 and the selection of the bit lines BL, and /BL is performed by a column decoder 116. In the embodiment of FIG. 2, the row decoder 114 includes a respective row decoder for each memory bank and the column decoder 116 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address and chip select (CA/CS) terminals coupled to a command and address bus to receive commands and addresses, and a CS signal, clock terminals to receive docks CK and CKB and to provide a data strobe DQS, data terminals DQ and DM, and power supply terminals to receive power supply potentials VDD, YSS, VDDQ, and VSSQ.

The clock terminals are supplied with external clocks CK and CKB that are provided to an input buffer 108. The external clocks may be complementary such that a rising, edge of one clock signal coincides with a falling edge of the other and vice versa. The input buffer 108 generates an internal clock ICLK based on the CK and CKB clocks. The ICLK clock is provided to the command decoder 106 and to an internal clock generator 110. The internal clock generator 110 provides various internal clocks CLK based on the ICLK clock. The CLK clocks may be used for timing operation of various internal circuits.

The clock generator 110 may generate one or more clock signals CLK responsive to the external clocks CK and CKB (via the CLK input buffer 108). As shown in the example of FIG. 1, two clock signals CLK are provided by the clock generator 110 along separate conductive flues. More (or less) clock signals CLK (and more or less corresponding conductive lines) may be provided in other examples. The CLK clocks may have a phase difference between them, such that there is a time offset between a rising edge of one of the CLK clocks and the other. In some embodiments, the CLK clocks may have a phase offset of 180° (e.g., half a period of the CLK clock) which may make the CLK clocks complementary to each other. In some embodiments, the CLK clocks may all have the same frequency, which may be less than a frequency of the external clocks CK and CKB.

The internal CLK docks are provided to the input/output circuit 122 to time operation of circuits included in the input/output circuit 122, for example, to data receivers to time the receipt of write data. The internal CLK clocks may pass through one or more drivers 130 between the internal clock generator 110 and the input/output circuit 122. The drivers 130 may help maintain the waveform of the clock signals as they travel through the device 100. As previously described, the CLK clocks may degrade as they pass through the conductive lines across the device 100. The driver 130 may act as a buffer to improve one or more characteristics of the CLK clocks (e.g., by increasing the current). The driver 130 may receive each of the CLK clocks as an input and provide a corresponding CLK clock as an output. The drivers 130 may be coupled to voltages supplied by the voltage generator 124 and/or provided from outside the device 100 (e.g., Vdd, Vss), in some embodiments, the driver 130 may be an inverting buffer, which provides an output CLK clock which is complementary to the corresponding input CLK clock. In some embodiments, the driver 130 may be a non-inverting buffer, which provides an output CLK clock which has approximately the same phase as the corresponding input CLK clock.

The CA/CS terminals may be supplied with memory addresses. The memory addresses supplied to the CA/CS terminals are transferred, via a command/address input circuit 102, to an address decoder 104. The address decoder 104 receives the address and supplies a decoded row address XADD to the row decoder 114 and supplies a decoded column address YADD to the column decoder 116. The CA/CS terminals may be supplied with commands. Examples of commands include timing commands for controlling the timing of various operations, access commands for accessing the memory, such as read commands for performing read operations and write commands for performing write operations, mode register write and read commands for performing mode register write and read operations, as well as other commands and operations.

The commands may be provided as internal command signals to a command decoder 106 via the command/address input circuit 102. The command decoder 106 includes circuits to decode the internal command signals to generate various internal signals and commands for performing operations. For example, the command decoder 106 may provide a row command signal ACT to select a word line and a column command signal R/W to select a bit line.

When a read command is received, and a row address and a column address are timely supplied with the read command, read data is read from memory cells in the memory array 118 corresponding to the row address and column address. The read command is received by the command decoder 106, which provides internal commands so that read data from the memory array 118 is provided to the read/write amplifiers 120. The read data is output to outside from the data terminals DQ via the input/output circuit 122. A DQS clock is provided externally from clock terminals for timing provision of the read data by the input/output circuit 122. The external terminals DQ include several separate terminals, each providing a bit of data synchronized with a dock edge of the DQS dock. The number of external terminals DQ corresponds a data width, that is, a number of bits of data concurrently provided with a clock edge of the DQS clock.

When the write command is received, and a row address and a column address are timely supplied with the write command, write data supplied to the data terminals DQ written to a memory cells in the memory array 118 corresponding to the row address and column address. A data mask may be provided to the data terminals DM to mask portions of the data when written to memory. The write command is received by the command decoder 106, which provides internal commands so that the write data is received by data receivers in the input/output circuit 122. A DQS clock is also provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC. As previously described, the external terminals DQ include several separate terminals. With reference to a write operation, each external terminal DQ receives a bit of data, and the number of external terminals DQ corresponds to a data width of bits of data that are concurrently received synchronized with a clock edge of the DQS dock.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder 114, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

FIG. 2 is a schematic diagram of a clock path in a semiconductor memory device according to an embodiment of the present disclosure. The clock path 200 may represent the distribution of clock signals within a semiconductor memory device, such as the semiconductor memory device 100 of FIG. 1. For clarity, FIG. 2 shows the clock path passing through the device, and omits connections to other components.

The clock path 200 may include a frequency divider circuit (divider circuit) 210, which may receive clock signals CK and MB. In some embodiments, the divider circuit 210 may be an implementation of the clock input buffer 108 and/or internal clock generator 110 of FIG. 1. The clock signals CK and CKB may be complementary to each other, and in some embodiments may be system clocks provided to the memory device. The divider circuit 210 provides multiple clock signals which may be based on CK and/or CKB. In the example embodiment of FIG. 2, four clock signals are provided, although more or less clock signals may be used in other embodiments. The four clock signals are provided to 3 drivers 230a-c, which are each coupled to all four clock signals. The three drivers 230a-c are coupled in series along the clock path 200. The third driver 230c provides the four clock signals to a DQ circuit 222 which also receives data from the device. The DQ circuit 222 provides a data output DQn which may be timed based on one or more of the four clock signals.

The frequency divider circuit 210 may generate the CLK clocks responsive to the CK and CKB clocks. The CLK clocks may have a frequency which is based on the CK and CKB clocks. The frequency of the CLK clocks may be greater than, less than, or the same as, the frequency of the CK and CKB clocks. For example, in some embodiments, the frequency of the CLK clocks may be half the frequency of the CK and CKB docks. In some embodiments, the frequency divider circuit 210 may generate multiple CLK docks from the CK and CKB docks. While the clock path 200 depicts four dock signals, it is to be understood that more or less clock signals may be provided in other embodiments. For example, in some embodiments, there may be two dock signals provided by the divider circuit 210 and received by the DQ circuit 222. Other numbers of clock signals may be provided by the divider circuit 210 in other examples.

The dock path 200 may include one or more drivers 230a-c. In the example layout of FIG. 2, the clock path 200 is shown as including three drivers 230a-c, however more or less drivers may be provided in other example clock paths. As shown, there is a first driver 230a positioned near the frequency divider circuit 210, a third driver 230c positioned near the DQ circuit 222, and a second driver 230b positioned between the first and second driver 230a, c. The number of drivers 230a-c may be based, at least in part, on the length of the conductive elements carrying the CLK clocks between the frequency divider circuit 210 and the DQ circuit 222. Each of the drivers 230a-c may be identical to each other, or one or more of the drivers 230a-c may be different from the others.

Each driver 230a-c may receive the CLK clocks, and provide the CLK clocks. As shown, each driver 230a-c receives four CLK clocks and provides four CLK clocks. Each of the received CLK clocks may correspond to one of the provided CLK clocks. Each driver 230a-c may include a number of driver circuits. In some embodiments, each of the drivers 230a-c may include a number of driver circuits based on the number of coupled CLK clocks, with each driver circuit coupled to one of the CLK clocks. Multiple driver circuits may be coupled to each of the CLK clocks. For example, each of the CLK clocks may be coupled to two of the driver circuits. More or fewer driver circuits may be coupled to each of the CLK clocks in other examples. The arrangement of driver circuits is discussed in more detail in FIGS. 4-11.

The drivers 230a-c may change one or more properties of the CLK clocks in order to aid in their transmission along the clock path 200. For example, the drivers 230a-c may boost the current of each of the CLK clocks. In some examples the drivers 230a-c may operate as a buffer and/or inverter for each of the CLK clocks. The drivers 230a-c may be coupled to one or more power supply voltages of the system (e.g., Vdd, Vss, ground, etc.) which may provide power to the driver 230a-c to buffer the clock signals CLK. The drivers 230a-c may be configured to minimize the voltage noise introduced by the power supply voltages to the clock signals CLK.

In embodiments where there are multiple CLK clocks, each of the CLK clocks may have a phase relative to each other. It may be desirable to maintain these phase differences as the CLK clocks travel along the clock path 200. The clock paths for each of the CLK clocks may all have equivalent RC delays to each other in order to maintain the phase differences between the clock signals CLK. In order to align the RC delays along the CLK clock paths, the load of each of the buffers 230*a-c* may be made approximately equivalent.

As previously discussed, in some embodiments, each driver 230*a-c* may include a number of driver circuits. In some embodiments, the drivers 230*a-c* may be arranged so that all of the driver circuits have approximately the same load and/or RC delay. In some embodiments, the driver circuits for a given one of the drivers 230*a-c* may be positioned in the same region of the chip. In some embodiments, the driver circuits for a given one of the drivers 230*a-c* may all have similar layout designs to each other. The similar location and/or layout of the driver circuits for a given one of the drivers 230*a-c* may help ensure that each driver circuit imposes a delay on the coupled clock signal which is approximately the same as the delay imposed by the other driver circuits of that driver 230*a-c*.

Figure 3:
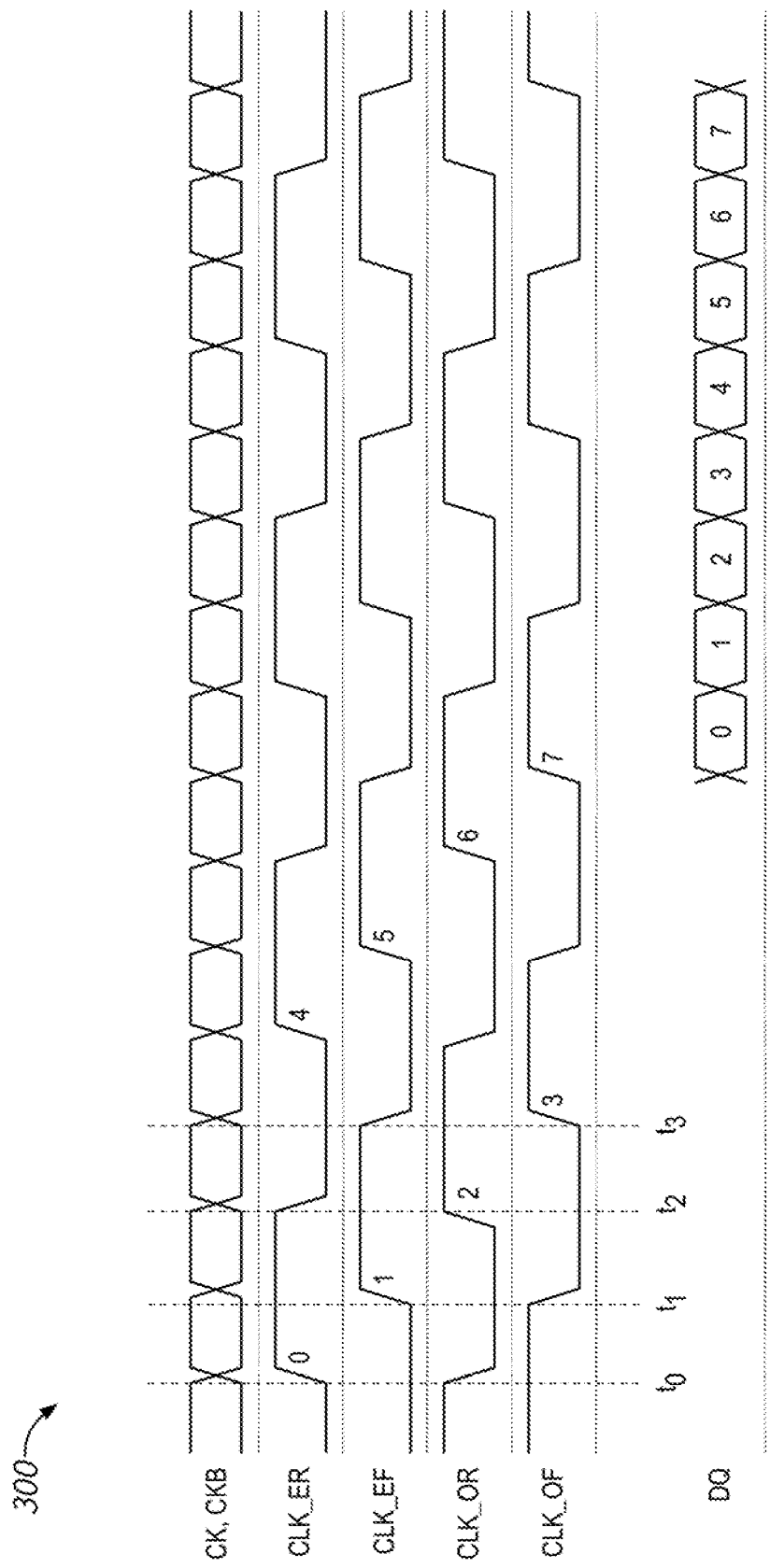
FIG. 3 is a timing diagram of clock signals according to an embodiment of the present disclosure.

FIG. 3 is a timing diagram of clock signals according to an embodiment of the present disclosure. The timing diagram 300 may illustrate example waveforms for clock signals in a memory device. In some embodiments, the timing diagram 300 may illustrate the clock signals of the clock path 200 of FIG. 2. While the example timing diagram 300 of FIG. 3 shows certain specific clock signals and waveforms, it is to be understood that these are provided for illustrative purposes only. Other clock signals may be used, and may have other frequencies, waveforms, etc.

The first line of the timing diagram 300 shows the system clocks CK and CKB. The system clocks are complementary to each other, which means that a rising edge of one clock signal coincides with a falling edge of the other clock signal, and vice versa. At a first time t0, the clock CK may begin rising from a low value (e.g., a low voltage) to a high value (e.g., a high voltage) while the clock CKB may begin falling from a high value to a low value. At a time t1, the clock CK begins falling while the clock CKB begins rising. This pattern continues at times t2 and t3 and beyond. Accordingly, the time between t0 and t2 may be a one period of the clock signals CK and CKB.

The second, third, fourth, and fifth lines of the timing diagram 300 show individual clocks CLK_ER, CLK_EF, CLK_OR, and CLK_OF respectively. These clocks may be generated responsive to the system clocks CK and CKB. The CLK clocks may have a frequency that is half a frequency of the CK and CKB clocks. In some embodiments, the CLK clock signals may be generated by the frequency divider circuit 240 of FIG. 2.

At t0, the clock signal CLK_ER (and CK) begin increasing from a low level to a high level. At t1, the clock signal CLK_EF (and CKB) begin increasing from a low level to a high level. At t2, the clock signal CLK_OR (and CK) begin increasing from a low level to a high level. At t3, the clock signal CLK_OF (and CKB) begins increasing from a low level to a high level. Accordingly, each of the four CLK clock signals may be offset from each other by ¼ of their period (e.g., a phase difference of 90°). Accordingly, CLK_ER and CLK_OR may be complementary to each other, and CLK_EF and CLK_OF may be complementary to each other.

The sixth line of the timing chart 300 shows the data signal DQ. The data signal DQ may match of frequency of the system clocks CK and CKB The system may provide data bits along terminals corresponding to the rising edge of the CLK clock signals. For example, the rising edge of CLK_ER at t0 may cause the system to provide information corresponding to data bit 0. Similarly, the rising edge of CLK_EF may cause the system to provide information corresponding to data bit 1, etc. After t3, the next rising edge of CLK_ER may cause the system to provide information corresponding to data bit 4. In this manner the system may provide data bits 0-7. In some embodiments, the system may provide data on both the rising and falling edges of each of the CLK clocks, and thus only two CLK clocks may be required for the system to provide data bits 0-7.

Figure 4:
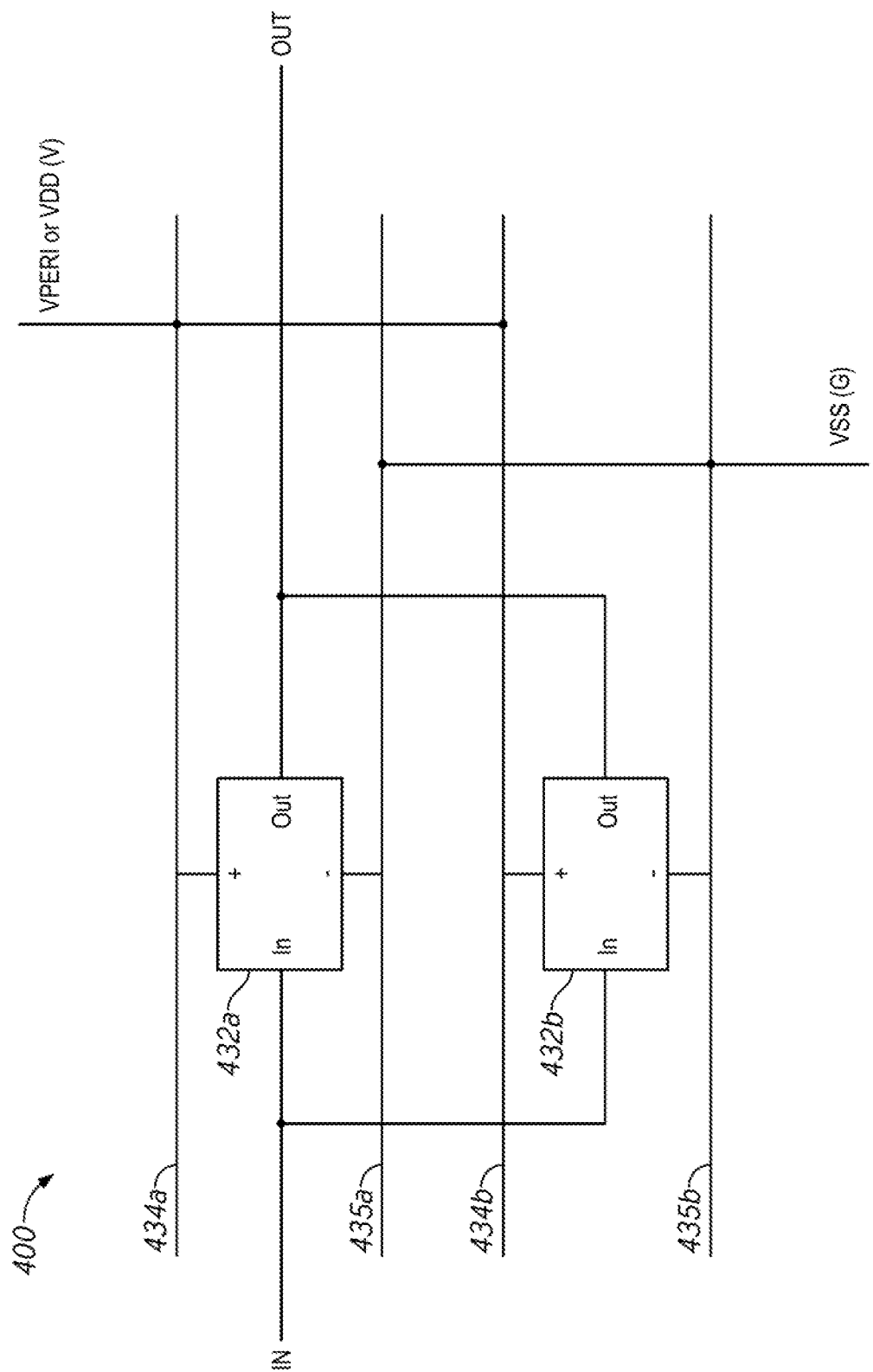
FIG. 4 is a schematic diagram of a driver according to an embodiment of the present disclosure.

FIG. 4 is a schematic diagram of a driver in accordance with an embodiment of the present disclosure. The driver 400 may be an implementation of the driver 130 of FIG. 1 for a single clock signal. The driver 400 may have an input IN and an output OUT. The driver 400 may include two driver circuits 432*a* and 432*b*. Each of the driver circuits 432*a-b* includes an input In, an output Out, a high voltage terminal +, and a low voltage terminal −. The driver 400 may also include a first and second high voltage line 434*a,b* and a first and second low voltage line 435*a,b*. The high voltage lines 434*a,b* and the low voltage lines 435*a,b* may be coupled to the high and low voltage terminals (+/−) of the driver circuits 432*a,b* as described herein.

The driver circuits 432*a,b* may be coupled in parallel between the input IN and the output OUT of the driver 400. In particular, the inputs In of the driver circuits 432*a,b* may be coupled in parallel to the overall input IN of the driver 400 and the outputs Out of the driver circuits 432*a,b* may be coupled in parallel to the overall output OUT of the driver 400. The two driver circuits 432*a,b* may be substantially similar to each other. In some embodiments, the two driver circuits 432*a,b* may be identical to each other.

Each of the driver circuits 432*a,b* may generally function as a buffer for the received clock signal. The driver circuits 432*a,b* may be amplifiers with a gain. In some embodiments the gain of the driver circuits 432*a,b* may be 1. In some embodiments, the gain of the driver circuits 432*a,b* may be −1, and the driver circuits 432*a,b* may be inverters. Each of the driver circuits may be coupled to high and low voltages at respective high and low voltage terminals +/− to provide power to the driver circuit 432*a,b*.

The first and the second high voltage lines 434*a,b* may both be coupled to a high voltage of the device (e.g., device 100 of FIG. 1). The high voltage may be coupled to a conductive line (e.g., voltage wiring) which is coupled to the first and second high voltage lines 434*a, b*. The high voltage may be a voltage provided to the device (e.g., Vdd) from an external component or a voltage provided by a voltage generator (e.g., voltage generator 124 of FIG. 1) such as VPERI. The first and second low voltage lines 435*a,b* may be coupled to a low voltage of the device (e.g., Vss, ground) which may be provided by an external source or generated by the voltage generator of the device. The low voltage may be provided along a conductive line which is coupled to the first and second low voltage lines 435*a,b*. The conductive lines coupled to the high and low voltage may extend in a different direction than the high voltage lines 434*a,b* and the low voltage lines 435*a,b*.

The first driver circuit 432*a* may be positioned between the first high voltage line 434*a* and the second high voltage line 434. The high voltage terminal + of the first driver circuit 432*a* may be coupled to the first high voltage line 434*a* and the low voltage terminal may be coupled to the first low voltage line 435*a*. In a similar fashion, the second driver circuit 434*b* may have its high voltage terminal + coupled to the second high voltage line 434*b* and the low voltage terminal coupled to the second low voltage line 435*b*. The first driver circuit 432*a* may be positioned between the first high and low voltage lines 434*a*, 435*a*, while the second driver circuit 432*b* may be positioned between the second high and low voltage lines 434*b*, 435*b*.

Since the first and second driver circuits 432*a,b* are coupled in parallel with each other, a current of the clock signal provided to the input IN may be divided between them. Similarly, a current of the signals provided by each of the driver circuits 432*a,b* may be combined at the output OUT. Accordingly, the overall driver 400 may provide a similar current to a driver with only one driver circuit, but each of the driver circuits 432*a,b* may draw less power. Accordingly, the driver circuits 432*a,b* may cause less voltage noise on the signal they each provide. Further, since the driver circuits 432*a,b* are coupled to separate high and low voltage lines, the noise along each line will have a smaller contribution to the overall noise on the signal.

Figure 5:
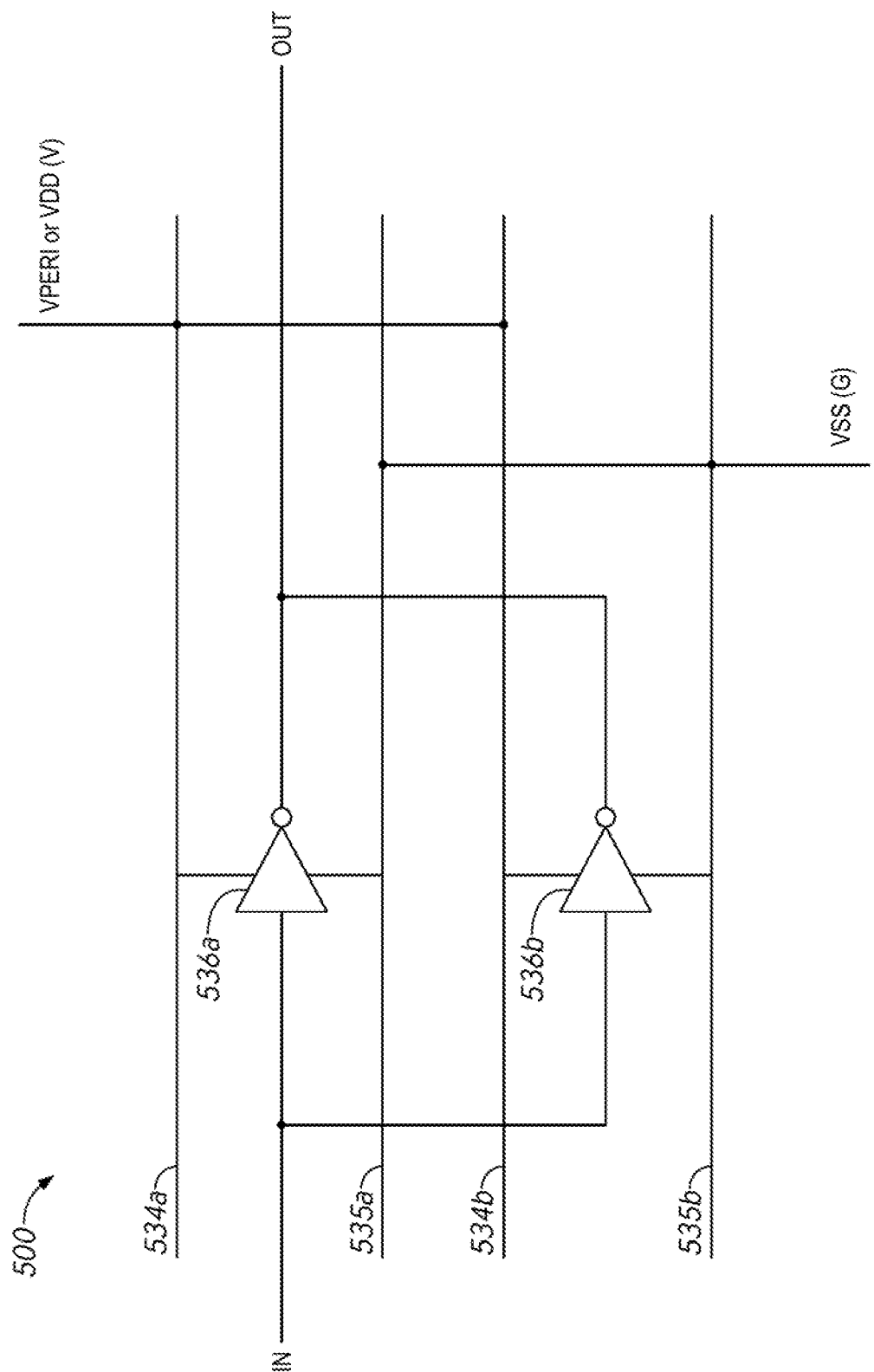
FIG. 5 is a schematic diagram of an inverter driver according to an embodiment of the present disclosure.

FIG. 5 is a schematic diagram of an inverter driver according to an embodiment of the present disclosure. The inverter driver 500 may be an implementation of the driver 400 of FIG. 4 in some embodiments. The inverter driver 500 may be generally similar to the driver 400, except that in the inverter driver 500, the generic driver circuits 432*a,b* have been replaced with inverters 536*a,b*. The inverters 536*a,b* may provide an output which is an inverse (or complement) of the input. In an example where the input is one of the CLK clock signals, when the input is at a high level, the inverter 536*a,b* may provide an output which is at a low level and vice versa. Since the two inverters 536*a,b* are coupled in parallel, the overall inverter driver 500 may also act as an inverter. Accordingly the CLK clock signal provided along the overall output OUT may be a complement of the CLK clock signal received along the overall input IN.

The inverters 536*a,b* may have a size which is dependent on the peak current through the inverter 536*a,b*. Accordingly, since the current of the signal along IN is divided between the inverters 536*a,b*, each of the inverters 536*a,b* may be smaller in size than if IN and OUT were coupled by a single inverter. For example, dimensions of each of the inverters 536*a,b* may be smaller in comparison to a single inverter. In some embodiments, the inverters of the driver 500 may be approximately half the size of an inverter used in a driver with a single inverter. The inverters 536*a,b* may have a P-channel with a size of approximately 50 μm and an N-channel with a size of approximately 25 μm.

Figure 6:
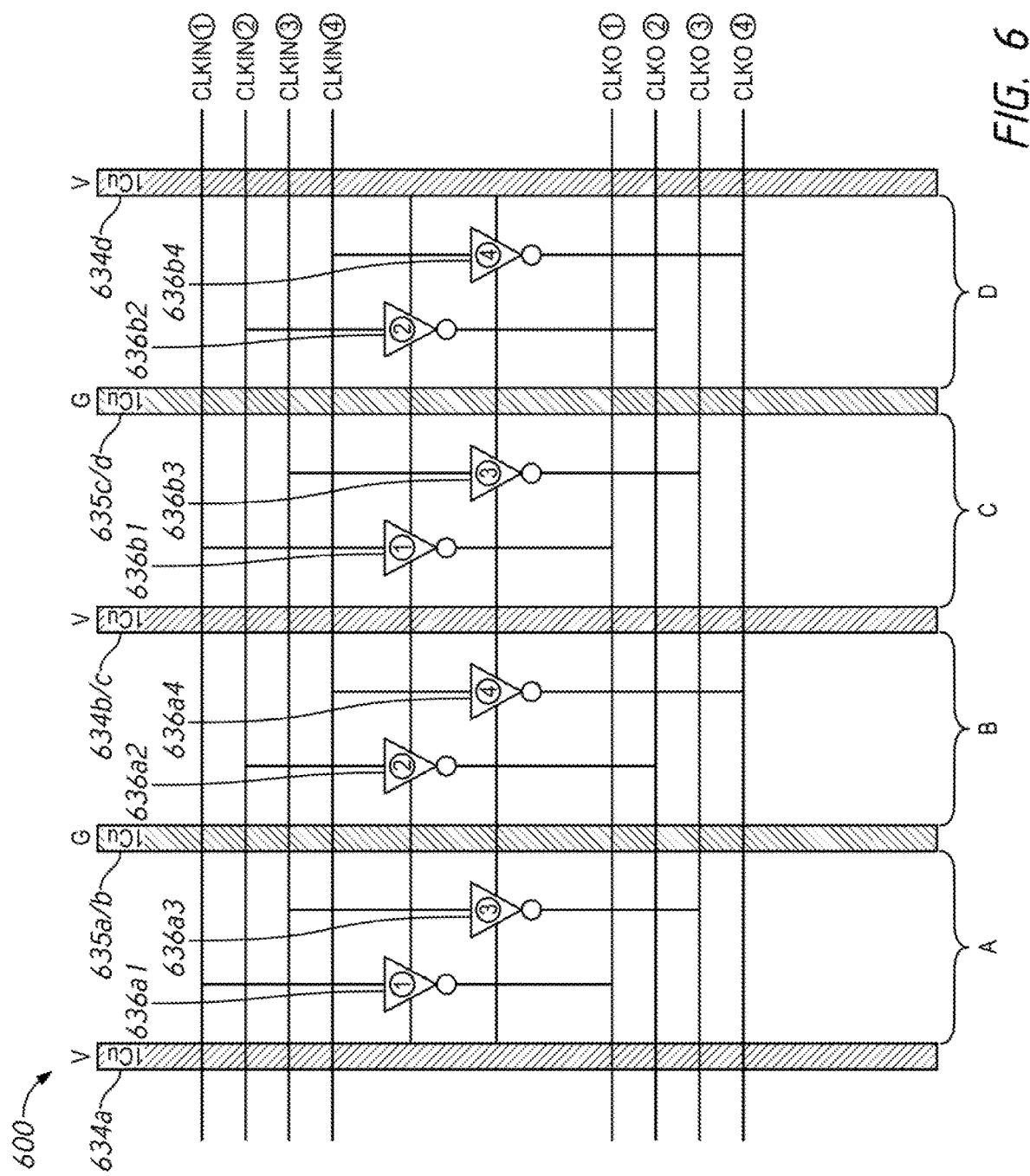
FIG. 6 is a schematic diagram of a driver according to an embodiment of the present disclosure.

FIG. 6 is a schematic diagram of a driver 600 according to an embodiment of the present disclosure. The driver 600 may be an implementation of the driver 130 of FIG. 1, where the driver 600 is configured to receive and provide four clock signals CLK1-4. Each of the clock signals CLK1-4 may experience a driver similar to the driver 400 of FIG. 4. For purposes of illustration, the driver 600 is shown with inverters 636*a*1-*b*4 similar to the inverters 536*a-b* of FIG. 5. However it is to be understood that the driver 600 could be arranged with any driver circuits in place of the inverters 636*a*1-*b*4.

The driver 600 receives four clock signals CLK1-4. The clock signals may arrive along respective input lines CLKIN1, CLKIN2, CLKIN2, and CLKIN4. In some embodiments, the input lines CLKIN1-4 may generally be parallel to each other. The driver provides the dock signals along respective output lines CLKO1, CLKO2, CLKO3, and CLKO4. Similar to the input lines, in some embodiments the output lines CLKO1-4 may generally be parallel to each other. In some embodiments, the input and output Hues CLKIN1-4 and CLKO1-4 may all be generally parallel to each other. Each corresponding input and output signal may be complementary to each other, since the driver 600 uses inverters 636*a*1-*b*4 in a layout generally similar to the driver 500 of FIG. 5. Thus, for example the signal along CLKO1 may be complementary to the signal along CLKIN1, etc.

The driver circuit 600 also has high voltage lines 634*a-d* and low voltage lines 635*a-d*. In some embodiments, the high and low voltage lines 634*a-d* and 635*a-d* may generally be parallel to each other. In some embodiments, the high and low voltage lines 634*a-d* and 635*a-d* may alternate with each other. In some embodiments, the high and low voltage lines 634*a-d* and 635*a-d* may generally be perpendicular to the input lines CLKIN1-4 and output lines CLKO1-4. In some embodiments, the high and low voltage lines 634*a-d* and 635*a-d* may be copper lines of the device. The high and low voltage lines 634*a-d* and 635*a-d* may lie at a different level of the device than the clock input and output lines and the inverters 636*a*1-*b*4. The high and low voltage lines 634*a-d* and 635*a-d* may be coupled to power supply voltage lines of the system via contact plugs.

Each pair of high and low voltage lines 634*a-d* and 635*a-d* may define a region A-D between them. Some of the high and low voltage lines 634*a-d* and 635*a-d* may be the same physical line. For example, the first region A is between high voltage line 634*a* and low voltage line 635*a*. Low voltage line 635*a* is also low voltage line 635*b* for the adjacent region 13. In a similar fashion, each of the regions A-D is bounded by a high and low voltage line, with the high and low voltage lines shared between adjacent regions except for high voltage tines 634*a* and 634*d* which are on the edges of the driver 600.

Each region A-D may include two driver circuits (in this example, inverters 636*a*1-*b*4). Region A may include inverters 636*a*1 and 636*a*3, region B may include inverters 636*a*2 and 636*a*4, region C may include inverters 636*b*1 and 636*b*3, and region D may include inverters 636*b*2 and 636*b*4. Each of the inverters 636*a*1-*b*4 may be coupled to the high and low voltage lines 634*a-d* and 635*a-d* along the edges of the region including that inverter 636*a*1-*b*4. For example, inverters 636*a*1 and 636*a*3 are each coupled to both high voltage line 634*a* and low voltage line 635*a* (which is also low voltage line 635*b*).

Each of the input lines CLKIN1-4 may be coupled to the corresponding output, line CLKO1-4 by a pair of the inverters 636*a*1-*b*4 coupled in parallel. The pair of inverters which couple a given input and output line may each be coupled to different of the high voltage lines 634*a-d* and different of the low voltage lines 635*a-d*. As an example, the input line CLKIN1 may be coupled to the output line CLKO1 by inverters 636*a*1 and 636*b* input line CLKIN2 may be coupled to the output line CLKO2 by inverters 636*a*2 and 636*b*2 etc. Each of the inverters which couple the input line to the corresponding output line may be positioned in a different one of the regions A-D. For example, the inverters 636*a*1 and 636*b*1 which couple CLKIN1 and CLKO1 are in regions A and C respectively.

The inverters may be divided between the regions of the driver 600 such that a given region contains inverters which couple clock signals which are complementary to each other. For example, the input CLKIN1 may be coupled to CLK_ER, input CLKIN2 may be coupled to CLK_EF, input CLKIN3 may be coupled to CLK_OR, and input CLKIN4 may be coupled to CLK_OF as described in the timing chart 300 of FIG. 3. Accordingly, region A may include inverters 636*a*1, 635*a*3 while region C may include inverters 636*b*1, 636*b*3. Inverters 636*a*1 and 636*b*1 and inverters 636*a*3 and 636*b*3 may be coupled to complementary signals along CLKIN1 and CLKIN3 respectively. Similarly, regions B and D may respectively include inverters 636*a*2, 636*a*4 and 636*b*2, 636*b*4 coupled to complementary signals along CLKIN2 and CLKIN4. Since the signals coupled to the inverters positioned in a given region A-D are complementary to each other, only one of the inverters in a given region may be coupled to a signal which is at a high value at any given time. The signals may also switch at the same time, so that a rising edge of one signal coincides with a falling edge of the other and vice versa. This may also help reduce the voltage noise in the circuit, by reducing the effect of switching noise and powered components in proximity to each other.

Figure 7:
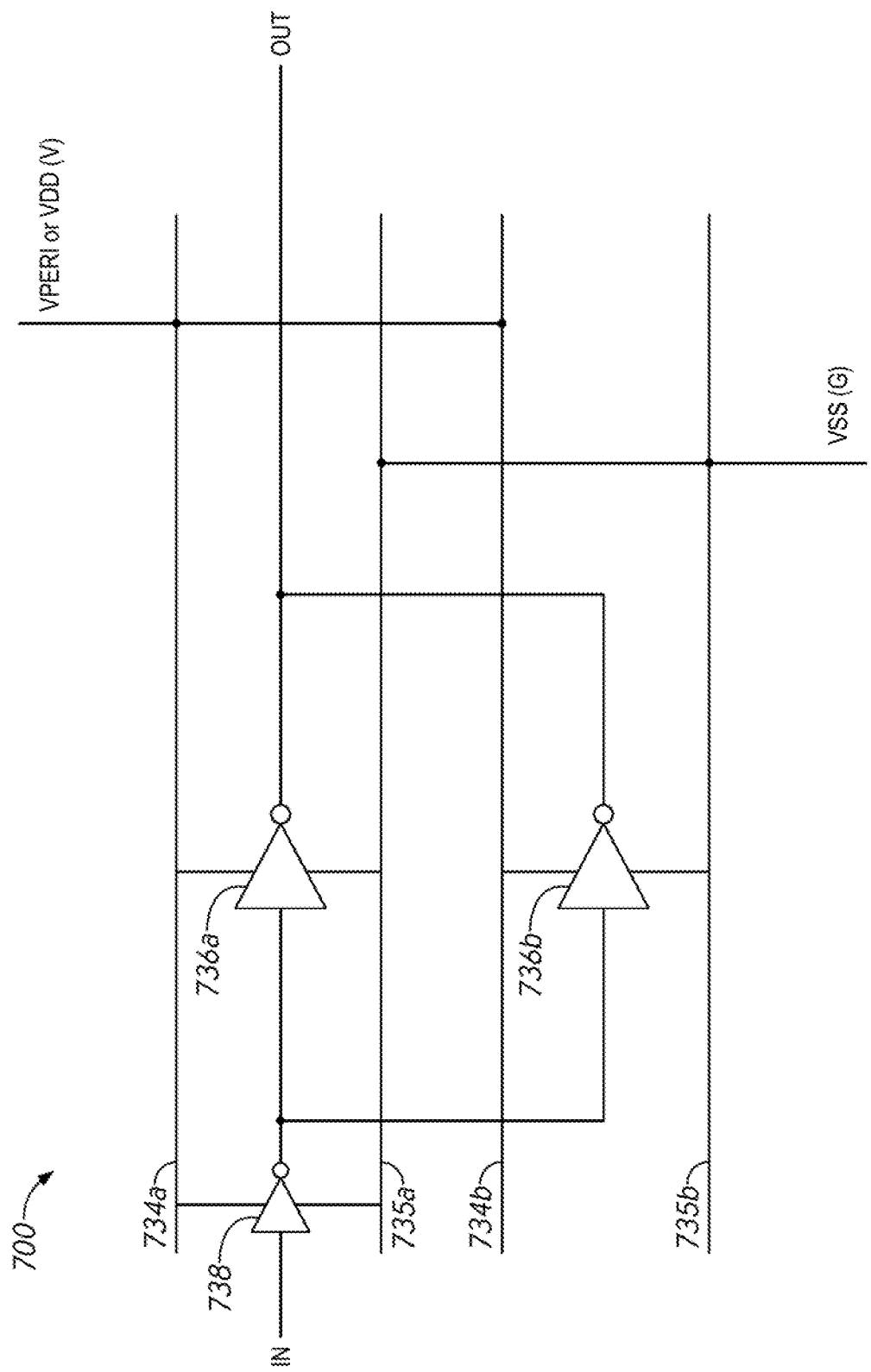
FIG. 7 is a schematic diagram of a non-inverting driver according to an embodiment of the present disclosure.

FIG. 7 shows a non-inverting driver according to an embodiment of the present disclosure. The driver 700 may be an implementation of the driver 130 of FIG. 1 in some embodiments. The driver 700 may generally be similar to the driver 500 of FIG. 5, except that the driver 700 is a non-inverting driver, and provides a signal along the output OUT which has approximately the same phase (e.g., is not inverted) as the signal along the input IN. The driver 700 includes an additional inverter 738 which has an input coupled to the overall input IN and an output which is coupled to the inputs of inverters 736*a,b*. The additional inverter 738 may be coupled to the first high voltage line 734*a* and the second high voltage line 735*a*. The additional inverter may be positioned between the first high and low voltage lines 734*a*, 735*a*.

In some embodiments, the additional inverter 738 may be a different size than the inverters 736*a,b*. In some embodiments, the additional inverter 738 may be of a smaller size than the inverters 736*a,b*. Since the additional inverter 738 is smaller, it may draw less current through the first high and low voltage line 734*a*, 735*a*, The additional inverter 738 may cause less voltage noise from the coupled high and low voltage lines to the coupled clock signal than the inverters 736*a,b*. In some embodiments, the dimensions of the additional inverter 738 may be smaller in comparison to the inverters 736*a,b*. For example, the additional inverter 738 may have a P-channel with a size of 8 µm and an N-channel with a size of 4 µm. The inverters 736*a,b* may have a P-channel with a size of 40 µm and an N-channel with a size of 20 µm.

Figure 8:
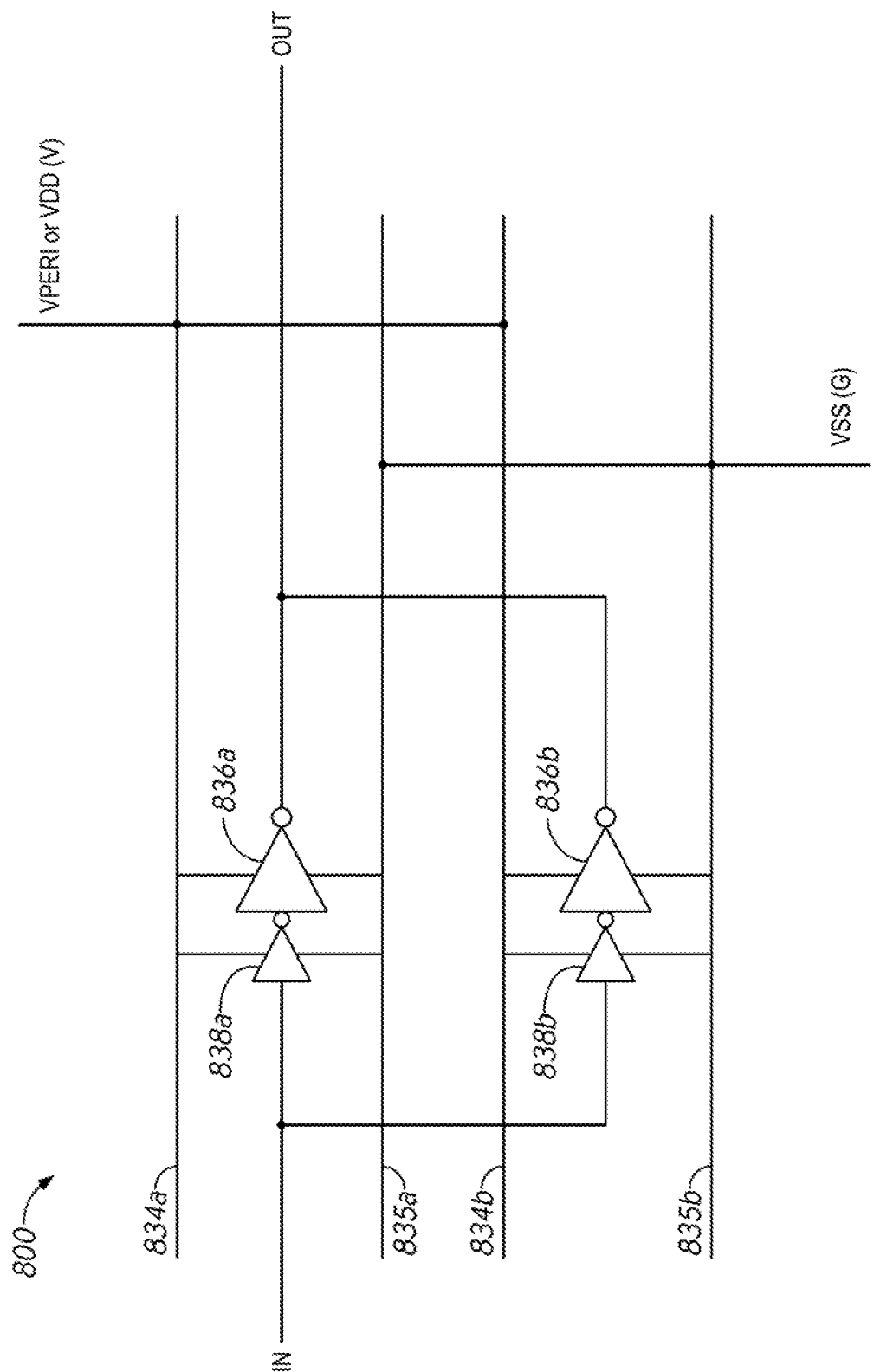
FIG. 8 is a schematic diagram of a non-inverting driver according to an embodiment of the present disclosure.

FIG. 8 is a schematic diagram of a non-inverting driver according to an embodiment of the present disclosure. In some embodiments, the driver 800 may implement the driver 130 of FIG. 1. The driver 800 may generally be similar to the driver 700 of FIG. 7, however in the driver 800 there are two additional inverters 838*a,b*. Accordingly, the driver 800 may provide an signal along the output OUT which is approximately the same phase (e.g., not inverted) as the signal along the input IN. The additional inverter 838*a* is coupled in series between the input IN and the inverter 836*a*, and is positioned between the first high and low voltage line 834*a* and 835*a* and coupled thereto. The additional inverter 838*b* is coupled in series between the input IN and the inverter 836*b*, and is positioned between the second high and low voltage lines 834*b* and 835*b* and coupled thereto. The additional inverters 838*a,b* and the inverters 836*a,b* may have similar sizes to the additional inverter 738 and the inverters 736*a,b* of FIG. 7, respectively.

Figure 9:
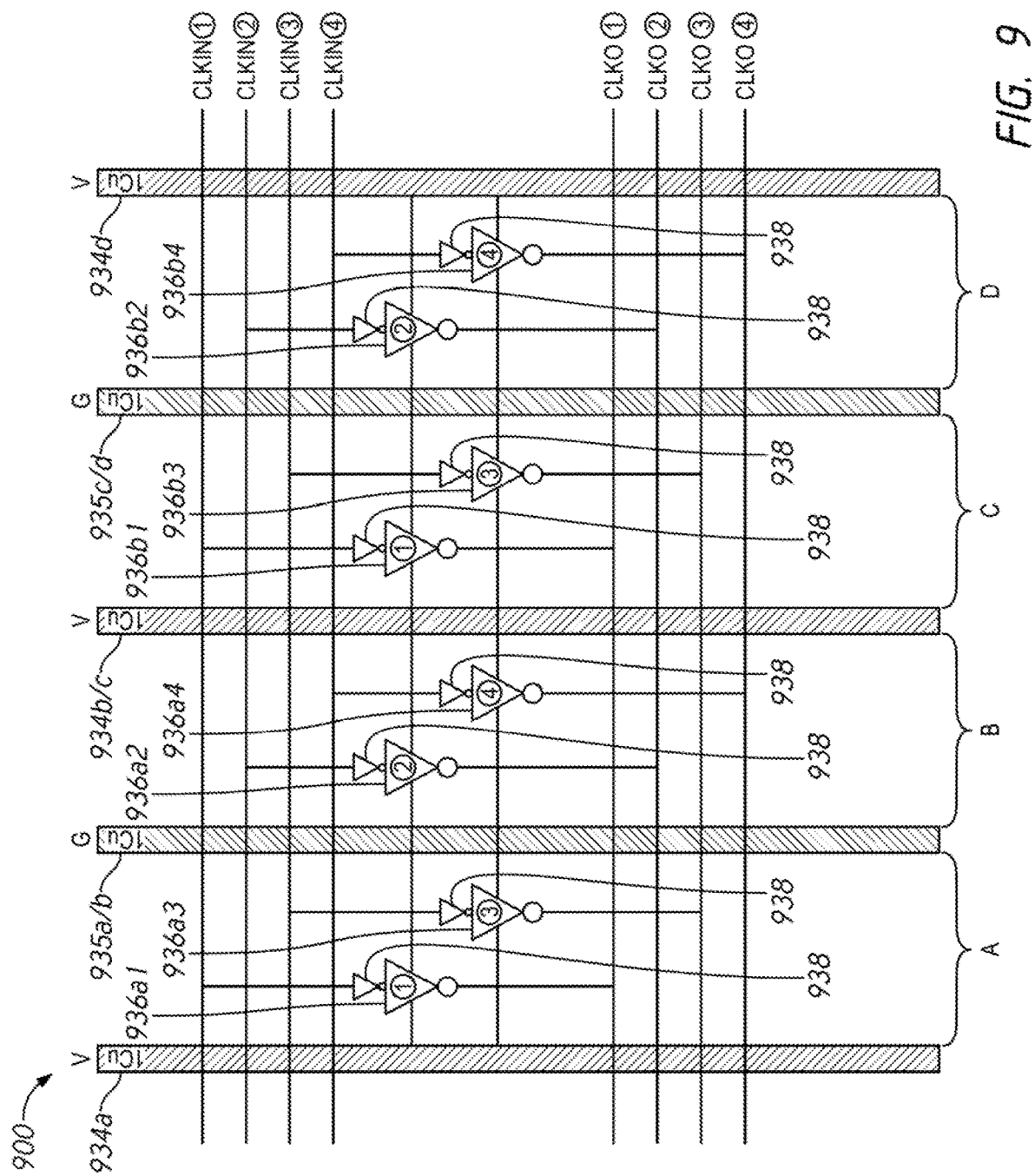
FIG. 9 is a schematic diagram of a non-inverting driver according to an embodiment of the present disclosure.

FIG. 9 is a schematic diagram of a non-inverting driver according to an embodiment of the present disclosure. In some embodiments, the driver 900 may implement the driver 130 of Figure. The driver 900 may be generally similar to the driver 600 of FIG. 6, except that the driver 900 is a non-inverting driver 900. For the sake of brevity, components and features similar to those of the driver 600 of FIG. 6 will not be described again with respect to FIG. 9.

Each clock signal may be coupled along an input line CLKIN1-4 and provided along a corresponding output line CLKO1-4. Each of the respective input and output lines may be coupled together in a manner similar to the coupling between the input IN and the output OUT of the driver 800 of FIG. 8. In particular, each of the inverters 936*a*1-*b*4 may have an input which is coupled to the output of an additional inverter 938. Although not shown in FIG. 9 for purposes of clarity, each of the additional inverters 938 may be coupled to the same high and low voltage lines 934*a-d* and 935*a-d* as the inverter 936*a*1-*b*4 that it is coupled to.

Figure 10:
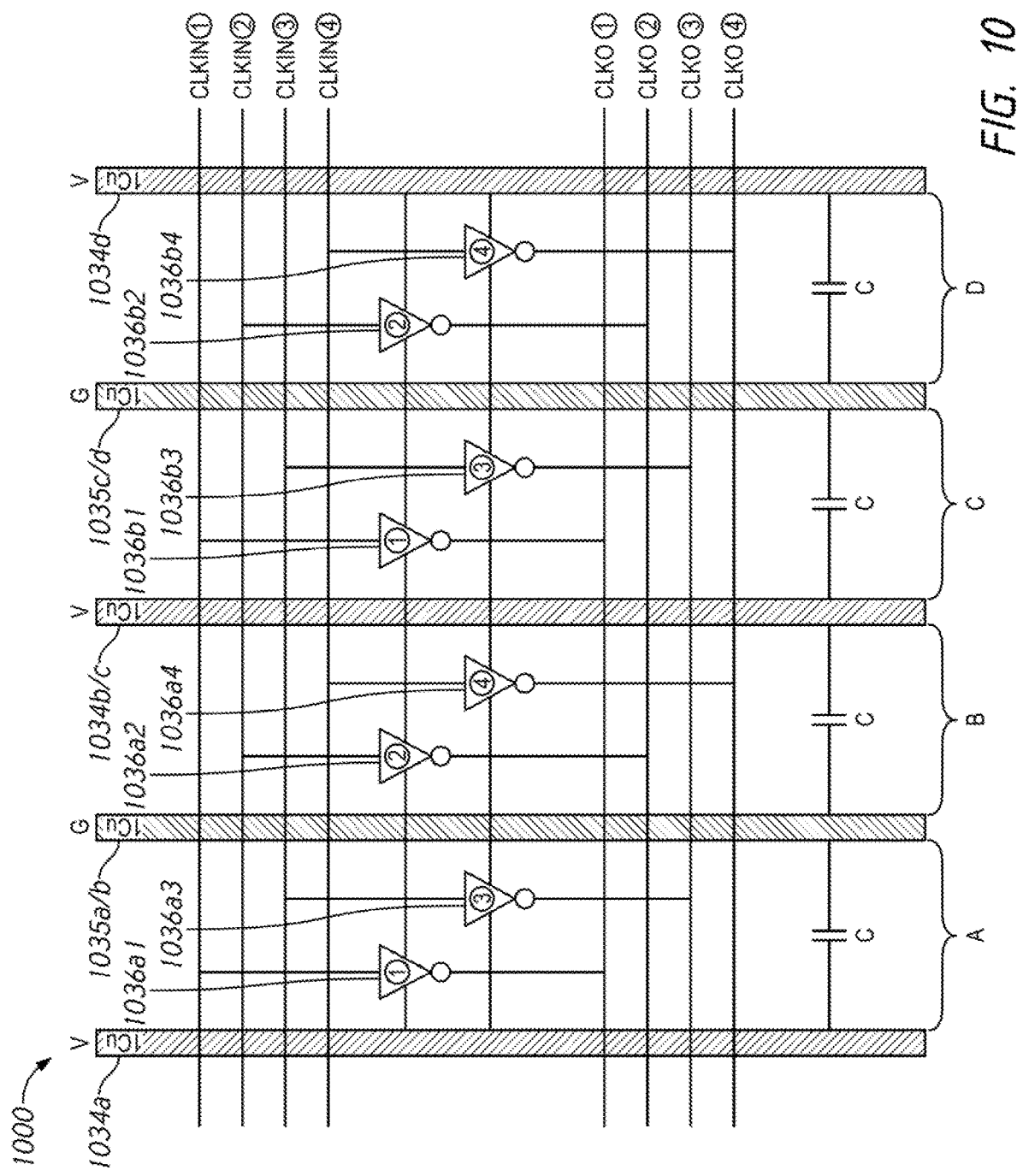
FIG. 10 is a schematic diagram of a driver according to an embodiment of the present disclosure.

FIG. 10 is a schematic diagram of a driver according to an embodiment of the present disclosure, in some embodiments, the driver 1000 may implement the driver 130 of FIG. 1. The driver 1000 may be generally similar to the driver 600 of FIG. 6, except that the high and low voltage lines 634*a-d* and 635*a-d* are coupled together with respective capacitors C. For the sake of brevity, components and features similar to those of the driver 600 of FIG. 6 will not be described again with respect to FIG. 9.

Although FIG. 10 shows the capacitors coupled in a driver 1000 with a layout similar to the driver 600 of FIG. 6, certain embodiments of the present disclosure may include capacitors coupled between the high and low voltage lines of any of the drivers discussed herein. The capacitors C may act to reduce noise along the high and low voltage lines 1034*a-d* and 1035*a-d*. Each of the capacitors C may be positioned in one of the regions A-D and coupled between the respective high voltage line 1034*a-d* and low voltage line 1035*a-d* which border that region. As an example, the high voltage line 1034*b/c*, which lies between regions B and C, may be coupled by a capacitor C to the low voltage line 1035*a/b*, and by another capacitor C to the low voltage line 1035*c/d*.

FIGS. 11A and 11B are diagrams of layout data for a driver according to an embodiment of the present disclosure. The driver 1100 may be the same in both FIG. 11A and FIG. 11B, however while all layout layers are shown in FIG. 11A, only the wiring layer is shown in FIG. 11B. In some embodiments, the driver 1100 may be an implementation of the driver 130 of FIG. 1. The driver 1100 may generally be similar to the driver 600 of FIG. 6. For the sake of brevity, components and features previously described will not be described again with regards to FIGS. 11A-B.

The driver 1100 may be separated into regions A-D, each of which contains inverters, which are here labeled 1-4 according which of the clock lines CLKIN1-4 and CLKO1-4 they couple. As may be seen, each set of input and output clock lines is coupled by two inverters, each of which is in a different region of the driver 1100. In particular, regions A and C contain inverters 1 and 3, while regions B and D contain inverters 2 and 4.

The driver 1100 receives signals along input clock lines CLKIN1 and CLKIN2 positioned along a top edge of the driver 1100 and input clock lines CLKIN3 and CLKIN4 positioned along a bottom edge of the driver 1100. The inverters may be positioned in the driver 1100 along a side with the corresponding input lines. Thus, inverters 1 and 2 are positioned along a top half of the driver 1100 (near the top edge with input lines CLKIN1 and CLKIN2), while the inverters 3 and 4 are positioned along a bottom half of the inverter 1100 (near the edge with the input lines CLKIN3 and CLKIN4).

The input lines CLKIN1-4 may extend across the driver 1100 generally perpendicular to the high and low voltage lines from a left side of the driver 1100 (nearest to region A) up to the last region A-D containing a corresponding inverter. Thus, CLKIN1 and CLKIN3 may end in region C and not extend into region D. The output lines CLKO1-4 may extend across the driver 1100, generally perpendicular to the high and low voltage lines, from a right side of the driver 1100 (nearest to region D) to the last region A-D containing a corresponding inverter. Thus, CLKO2 and CLKO4 may end in region B and not extend all the way into region A. The output lines CLKO1-4 may generally be positioned between the top and bottom edge of the driver 1100. The output lines CLKO1-4 may be positioned between the input lines CLKIN2 and CLKIN3.

One or more of the elements of the driver 1100 may be positioned on different layers. For example, where the driver 1100 is implemented on a silicon chip, the elements may be positioned on different metal layers. Couplings may be made between different layers via contact plugs. As shown in the layout of the driver 1100, the high and low voltage lines are positioned on a first layer. The inverters 1-4 are positioned on a second layer. The input lines CLKIN1-4 and the output lines CLKO1-4 may be on a third layer. The second layer may be between the first and third layers.

Figure 12:
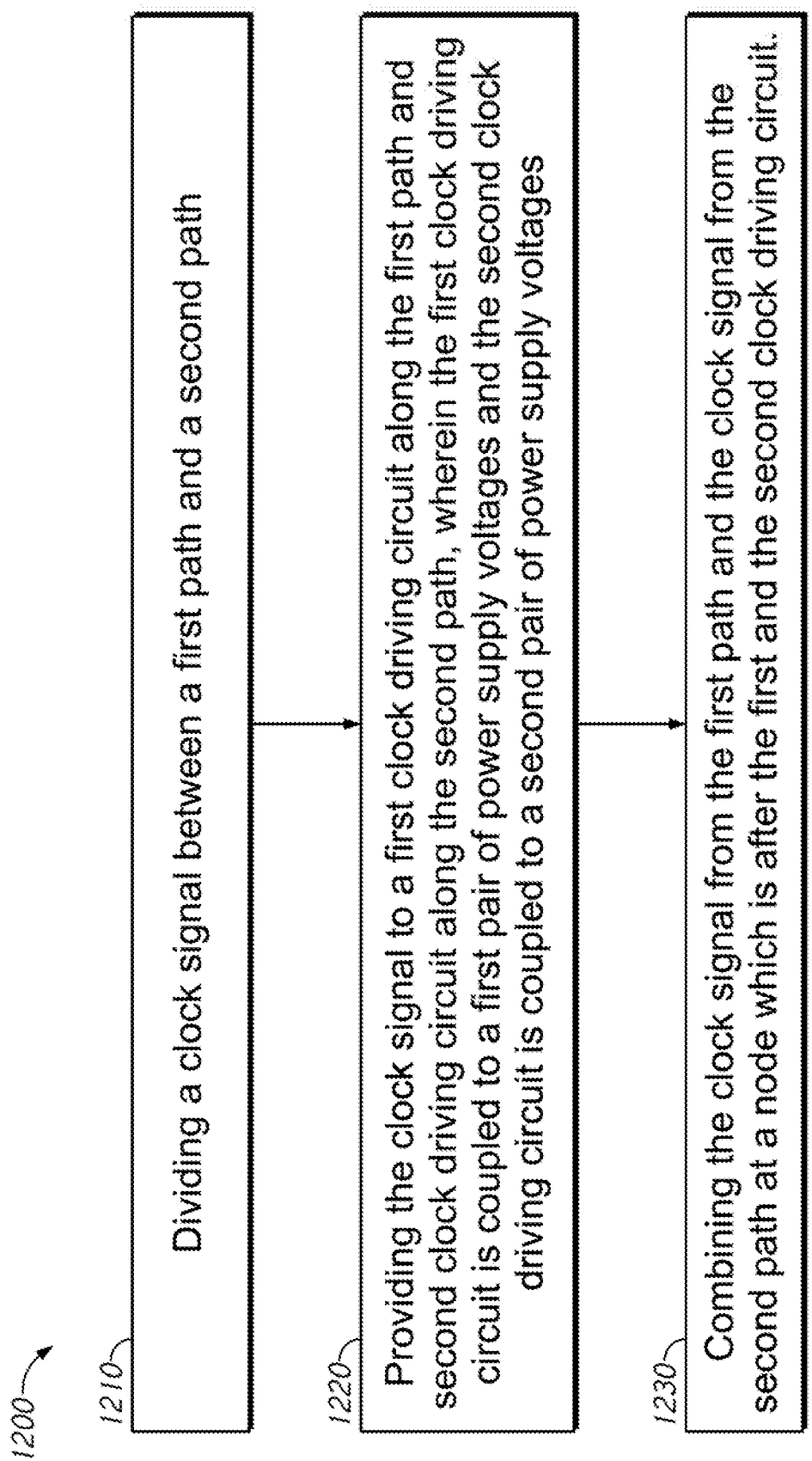
FIG. 12 is a flow chart depicting a method according to an embodiment of the present disclosure.

FIG. 12 is a flow chart depicting a method according to an embodiment of the present disclosure. The method 1200 may be implemented by the device 100 of FIG. 1 and/or one or more of the drivers described herein. The method 1200 may involve one or more steps described in blocks 1210-1230. These steps may occur in any order and more or fewer steps may be used in other examples. In some embodiments, one or more of the steps may be repeated.

Block 1210 describes dividing a clock signal between a first path and a second path. The clock signal may be received by a driver (e.g., driver 130 of FIG. 1). The clock signal may be divided between a first path and a second path that may be internal to the driver. The first path and the second path may be conductive elements which are coupled in parallel to a common node which receives the clock signal. The current of the clock signal may be divided to flow along the first path and the second path. In some embodiments, roughly half the current may flow along the first path and roughly half the current may flow along the second path. In some embodiments, the clock signal may be inverted before the dividing.

Block 1210 may generally be followed by block 1220, which describes providing the clock signal to a first driver circuit along the first path and second driver circuit along the second path. The first driver circuit may be coupled to a first pair of power supply voltage lines and the second driver circuit may be coupled to a second pair of power supply voltage lines. Each of the first and second pair of power supply voltage lines may include a high voltage line and a low voltage line. An input of the driver circuits may be coupled in common to the node which received the driver circuit. The driver circuits may be buffers and/or inverters. In some embodiments, the first path and the second path may include multiple driver circuits, such as multiple inverters coupled together in series.

Block 1220 may generally be followed by block 1230, which describes combining the clock signal from the first path and the clock signal from the second path at a node which is after the first and the second clock driving circuit. The current from the first path and the second path may be combined at the node. In some embodiments, the combined current at the node may be greater than the current of the clock signal before the dividing described in block 1210. The combined signal at the node may be provided as an output of the driver.

In some embodiments, additional clock signals may be provided. For example, the method 1200 may also include the steps such as dividing a second clock signal between a third path and a fourth path. The second clock signal may be complementary to the first clock signal. The method 1200 may also include providing the second clock signal to a third driver circuit along the third path and to a fourth driver circuit along the fourth path. The third driver circuit may be coupled to the first pair of power supply voltage lines and the fourth driver circuit may be coupled to the second pair of power supply voltage lines. The method 1200 may also include combining the second clock signal from the third path and the second clock signal from the fourth path at a second node which is after the third and fourth driver circuit.

In this manner, the first pair of power supply voltage lines may be coupled to both the first and third driver circuits, while the second pair of power supply voltage lines may be coupled to both the second and fourth driver circuits. Accordingly since the two clock signals are complementary, only one of the driver circuits coupled to either the first or the second pair of power supply voltage lines may be active at a given time.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
    a first conductive element elongated in a first direction;
    a second conductive element elongated in the first direction;
    a third conductive element elongated in the first direction;
    a fourth conductive element elongated in the first direction;
    a first driver circuit positioned between the first conductive element and the second conductive element, wherein the first conductive element and the second conductive element provide a first high voltage and a first low voltage, respectively; and
    a second driver circuit positioned between the third conductive element and the fourth conductive element, wherein the third conductive element and the fourth conductive element provide a second high voltage and a second low voltage, respectively, and wherein the first and second driver circuits have respective input terminals coupled in common to a first input signal line and respective output terminals coupled in common to a first output signal line.

2. The apparatus of claim 1, wherein the first conductive element, the second conductive element, the third conductive element, and the fourth conductive element are generally parallel to each other.

3. The apparatus of claim 1, wherein the first input signal line and the first output signal line are elongated in a second direction different from the first direction.

4. The apparatus of claim 3, wherein the second direction is perpendicular to the first direction.

5. An apparatus comprising:
a first conductive element elongated in a first direction;
a second conductive element elongated in the first direction;
a third conductive element elongated in the first direction;
a fourth conductive element elongated in the first direction;
a first driver circuit positioned between the first conductive element and the second conductive element;
a second driver circuit positioned between the third conductive element and the fourth conductive element, wherein the first and second driver circuit have respective input terminals coupled in common to a first input signal line and further have respective output terminals coupled in common to a first output signal line; and
a third driver positioned between the second conductive element and the third conductive element, wherein the third driver has an input terminal coupled to a second input signal line and an output terminal coupled to a second output signal line.

6. The apparatus of claim 5, further comprising:
a fifth conductive element elongated in the first direction;
a fourth driver circuit positioned between the fourth and the fifth conductive element, wherein the fourth driver circuit has an input terminal coupled to the second input signal line and an output terminal coupled to the second output signal line.

7. The apparatus of claim 1, wherein the first and the third conductive elements are coupled to a first system voltage, and wherein the second and the fourth conductive elements are coupled to a second system voltage.

8. An apparatus comprising:
a first driver circuit coupled to a first high voltage line and a first low voltage line, wherein the first high voltage line and the first low voltage elongate in a first direction; and
a second driver circuit coupled to a second high voltage line and a second low voltage line, wherein the second high voltage line and the second low voltage elongate in the first direction,
wherein an input of the first driver circuit is coupled in common with an input of the second driver circuit, and an output of the first driver circuit is coupled in common with an output of the second driver circuit.

9. The apparatus of claim 8, wherein the first driver circuit comprises a first inverter, and wherein the second driver circuit comprises a second inverter.

10. The apparatus of claim 9, further comprising an additional inverter, wherein the additional inverter is smaller than the first inverter and the second inverter.

11. The apparatus of claim 10, wherein an output of the additional inverter is coupled in common to the inputs of the first and the second inverter.

12. The apparatus of claim 10, wherein the additional inverter comprises a first additional inverter coupled to the first inverter and a second additional inverter coupled to the second inverter, wherein an input of the first and the second additional inverters are coupled in common.

13. An apparatus comprising:
a first driver circuit coupled to a first high voltage and a first low voltage;
a second driver circuit coupled to a second high voltage and a second low voltage;
a third driver circuit coupled to the first high voltage and the first low voltage; and
a fourth driver circuit coupled to the second high voltage and the second low voltage,
wherein an input of the first driver circuit is coupled in common with an input of the second driver circuit, and an output of the first driver circuit is coupled in common with an output of the second driver circuit, and
wherein an input of the third driver circuit is coupled in common with an input of the fourth driver circuit, and an output of the third driver circuit is coupled in common with an output of the fourth driver circuit.

14. The apparatus of claim 13, wherein the first and second driver circuit are coupled to a first signal and the third and fourth driver circuit are coupled to a second signal, and wherein the first signal and the second signal are complementary to each other.

15. The apparatus of claim 14, wherein the first and second driver circuit delay the first signal by a first delay and the third and fourth driver circuit delay the second signal by a second delay, wherein the first delay and the second delay are approximately equal to each other.

16. A method comprising:
dividing a clock signal between a first path and a second path;
providing a first part of the divided clock signal to a first clock driver circuit along the first path and a second part of the divided clock signal to a second clock driver circuit along the second path, wherein the first clock driver circuit provides a first clock signal at a first output and is coupled to a first pair of power supply voltage lines and wherein the second clock driver circuit provides a second clock signal at a second output and is coupled to a second pair of power supply voltage lines; and
combining the first clock signal from the first path and the second clock signal from the second path at a node to which the first and the second outputs are coupled.

17. The method of claim 16, further comprising:
inverting the first part of the divided clock signal with the first clock driver circuit to generate the first clock signal; and
inverting the second part of the divided clock signal with the second clock driver circuit to generate the second clock signal.

18. The method of claim 16, wherein the first pair of power supply voltage lines includes a first voltage line and a second voltage line, and wherein the second pair of power supply voltage lines includes a third voltage line and a fourth voltage line, wherein the first clock driver circuit is positioned between the first voltage line and the second voltage line, and wherein the second clock driver circuit is positioned between the third voltage line and the fourth voltage line.

19. The method of claim 16, further comprising:
dividing a second clock signal between a third path and a fourth path;
providing a first part of the second divided clock signal to a third clock driver circuit along the third path and a second part of the second divided clock signal to a fourth clock driver circuit along the second path, wherein the third clock driver circuit provides a third clock signal at a third output and is coupled to the first pair of power supply voltage lines and wherein the fourth clock driver circuit provides a fourth clock signal at a fourth output and is coupled to the second pair of power supply voltage lines; and combining the third clock signal from the third path and the fourth clock signal from the fourth path at a node to which the third and the fourth outputs are coupled.

20. The method of claim 16, wherein the first path is in a first region of a driver and the second path is in a second region of the driver.

* * * * *